United States Patent
Mori (10) Patent No.: US 7,433,793 B2
(45) Date of Patent: Oct. 7, 2008

(54) ERROR DETECTION APPARATUS AND METHOD AND SIGNAL EXTRACTOR

(75) Inventor: Kenji Mori, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 11/334,371

(22) Filed: Jan. 19, 2006

(65) Prior Publication Data

US 2006/0167639 A1    Jul. 27, 2006

(30) Foreign Application Priority Data

Jan. 21, 2005   (JP)   ............. 2005-013779

(51) Int. Cl.
*G01R 31/26* (2006.01)
(52) U.S. Cl. .............. 702/117; 702/118; 702/108; 324/500; 324/537; 324/763; 324/765; 714/718; 714/719; 714/735; 714/736; 714/819; 714/824; 365/189.01; 365/201
(58) Field of Classification Search ............. 702/117, 702/108, 118; 324/500, 537, 763, 765; 714/718, 714/719, 735, 736, 819
See application file for complete search history.

(56) References Cited

U.S. PATENT DOCUMENTS 6,088,819 A * 7/2000 Adachi et al. .............. 714/718
6,351,835 B1 * 2/2002 Sakaguchi .................. 714/724
6,995,554 B2 * 2/2006 Loke et al. ................ 324/76.54
2001/0040379 A1 * 11/2001 Sakaguchi .................. 324/765
2001/0043079 A1 * 11/2001 Sakaguchi .................. 324/765
2004/0263198 A1 * 12/2004 Binkley et al. ............. 324/765

FOREIGN PATENT DOCUMENTS

JP    2003-185698 A    7/2003

* cited by examiner

*Primary Examiner*—Tung S. Lau
*Assistant Examiner*—Sujoy K Kundu
(74) *Attorney, Agent, or Firm*—Sughrue Mion, PLLC (57) ABSTRACT

A modulated voltage signal modulated at a predetermined frequency f0 is supplied to an integrated circuit under test to be tested set at an arbitrary stationary point, and an observation signal containing information on power supply current flowing through the integrated circuit under test at the stationary point. Then, a determination signal from which DC component is removed is extracted from the observation signal and supplied to a determination device. The determination device compares the size of spectral component of the determination signal at the predetermined frequency f0 between each measurement point and determines that an error exists in the integrated circuit under test if a difference is a predetermined value or greater.

24 Claims, 8 Drawing Sheets

RELATED ART

Fig. 9A

RELATED ART

Fig. 9B

RELATED ART

Fig. 10A

RELATED ART

Fig. 10B

RELATED ART

Fig. 10C

ERROR DETECTION APPARATUS AND METHOD AND SIGNAL EXTRACTOR

BACKGROUND OF THE INVENTION

1. Field of the Invention

The present invention relates to a signal extractor that extracts a determination signal for detecting an error in a bridge included in a complementary metal-oxide semiconductor (CMOS) large-scale integrated (LSI) circuit, for example, and an error detection apparatus and an error detection method that detect an error by using the determination signal.

2. Description of Related Art

Redundant errors such as bridge error due to high resistance short-circuit between source, drain or bulk in a CMOS LSI causes an increase in current consumption in the entire LSI, though it does not affect functional operation.

IDD Quiescent ($I_{DDQ}$) test is a technique to detect such an error. Consumption current (power supply current) of each inverter in LSI is very low during stationary time when each CMOS inverter that forms the LSI does not perform switching. On the other hand, the power supply current level increases when an error such as a bridge error occurs in LSI. The $I_{DDQ}$ test makes use of this and measures a power supply current IDD, which is referred to herein also as the static current $I_{DDQ}$, in the stationary time, thereby determining if an error exists or not.

Though consumption current of each CMOS inverter is low, the number of CMOS inverters in a chip is as many as several hundreds thousands to several millions in a large scale LSI, and consumption current that flows constantly is significantly high even in the stationary state. Further, with the miniaturization of a LSI manufacturing process, consumption current of each CMOS inverter is becoming higher and higher so that the entire consumption current reaches several tens mA order in some cases. Since the current that flows due to a bridge error is lower than original consumption current, it is unable to detect the bridge error completely merely in the stationary state. It is therefore necessary to supply a pattern that serves as a test signal to the LSI to activate a transistor and stop it at various points and measure a static current $I_{DDQ}$ at those times.

Figure 9A:
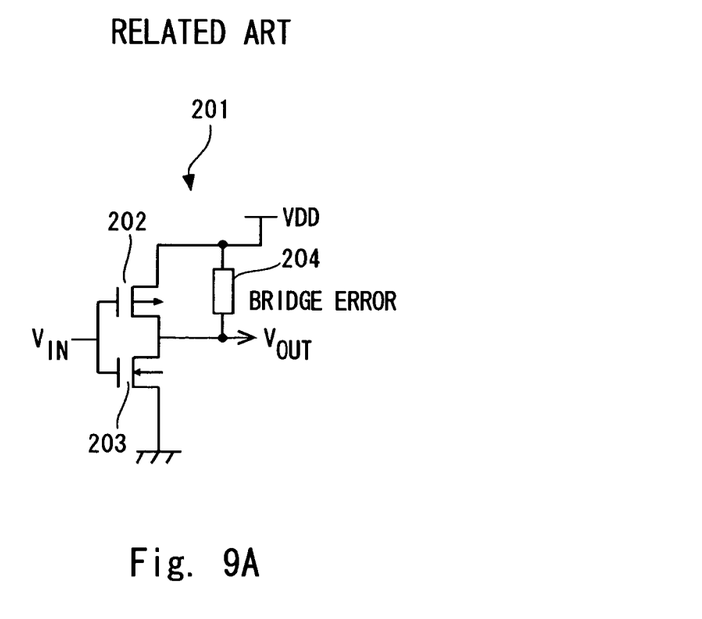
FIGS. 9A and 9B are pattern diagrams to describe bridge errors.
Figure 9B:
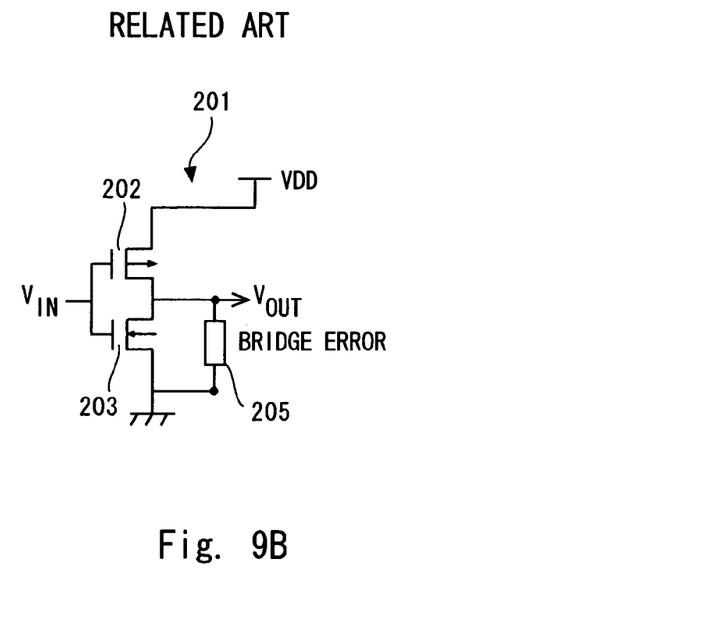
Figure 10A:
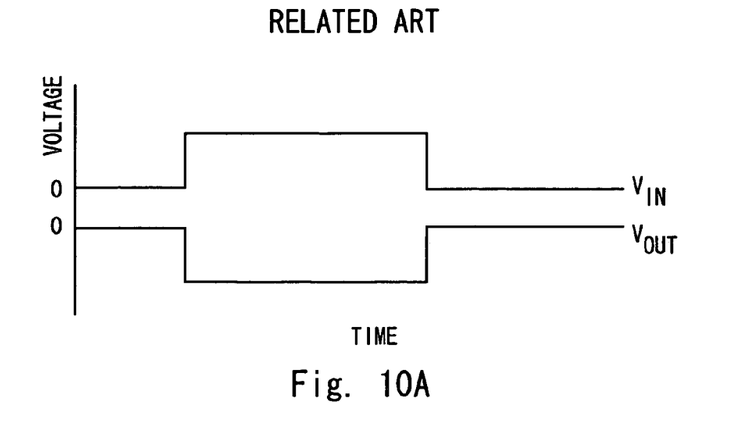
FIGS. 10A to 10C are views to describe power supply current levels with a bridge error and without a bridge error.
Figure 10B:
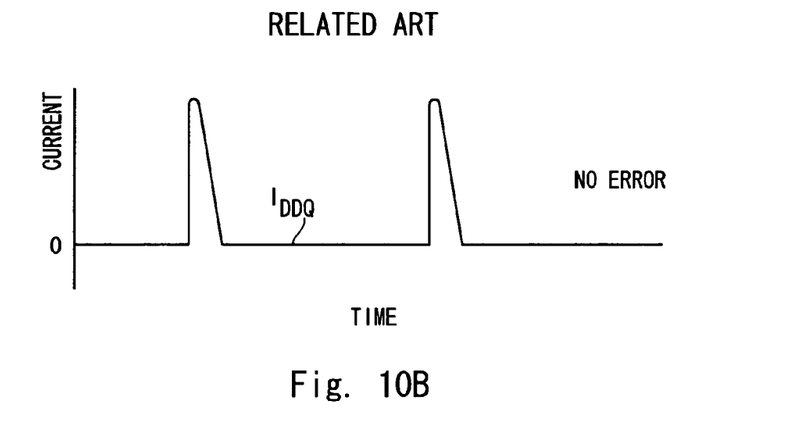
Figure 10C:
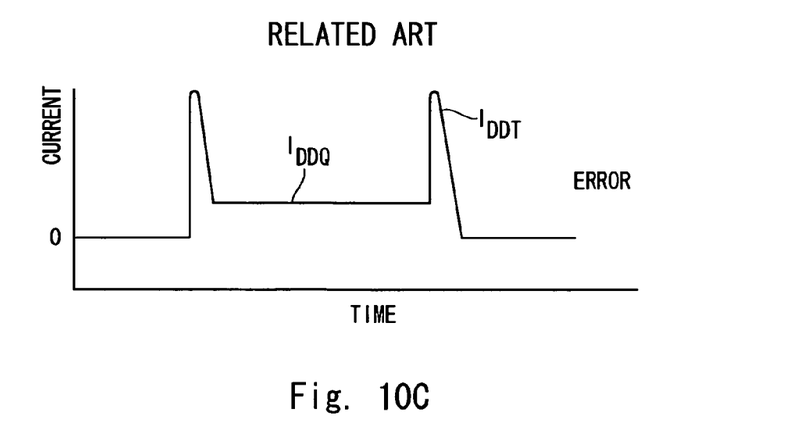

FIGS. 9A and 9B are block diagrams to describe a bridge error. FIGS. 10A to 10C are block diagrams showing power supply current when a bridge error occurs and when it does not occurs. For example, in a CMOS inverter 201 composed of a P-channel transistor 202 and an N-channel transistor 203 that are connected between a power supply VDD and a ground GND, a bridge error 204 occurs between the power supply VDD and an output $V_{OUT}$ to keep connecting them as shown in FIG. 9A or it occurs between the ground GND and the output $V_{OUT}$ to keep connecting them as shown in FIG. 9B.

As described earlier, a power supply current $I_{DD}$ becomes high only in the switching operation and a static current $I_{DDQ}$ in the stationary state is very low when no bridge error occurs. When a bridge error occurs, on the other hand, the static current $I_{DDQ}$ is higher in a given stationary point compared with when no bridge error occurs.

For example, when the bridge error 204 occurs as shown in FIG. 9A, even if output $V_{OUT}$ of the CMOS inverter 201 is Low, which is, when input $V_{IN}$ is High and the P-channel MOSFET 202 is OFF and the N-channel MOSFET 203 is ON, leakage current flows into the output terminal from the power supply VDD through the bridge error 204. Thus, the power supply current $I_{DDQ}$ in standby state is substantially zero when no error exists as shown in FIG. 10B. When, on the other hand, the bridge error 204 exists, the power supply current $I_{DDQ}$ increases if the output $V_{OUT}$ of the CMOS inverter 201 is Low as shown in FIGS. 10A and 10C. If the output $V_{OUT}$ Of the CMOS inverter 201 is High, which is when the P-channel MOSFET 202 is ON and the N-channel MOSFET 203 is OFF, leakage current does not flow. Therefore, the static current $I_{DDQ}$ stays substantially zero even when the error exists.

Similarly, when the bridge error 205 occurs as shown in FIG. 9B, leakage current flows into the ground GND through the bridge error 205 if the output $V_{OUT}$ of the CMOS inverter 201 is High while leakage current does not flows if the output $V_{OUT}$ is Low. Therefore, the power supply current $I_{DDQ}$ increases in the standby state in this case as well. In this way, it is possible to detect a bridge error occurring in a circuit by fixing the output $V_{OUT}$ of the CMOS inverter 201 to High or Low and measuring a the static current $I_{DDQ}$. Such a test method for detecting a bridge error in the CMOS inverter 201 is the $I_{DDQ}$ test.

On the other hand, an error detection apparatus for IC that is disclosed in Japanese Unexamined Patent Application Publication No. 2003-185698 uses a method for detecting an error by measuring power supply current during operation. By contrast with the static power supply current $I_{DDQ}$, dynamic power supply current (consumption current) is referred to herein as operation current $I_{DDT}$. This error detection apparatus detects an error by analyzing the frequency of a power supply current that flows through an integrated circuit under test when a test signal is applied thereto. The apparatus includes DC component removal means for removing DC components from a current observation signal of power supply current that flows through the integration current and extracting AC components only in order to keep low limiting resolution in spite of an increase in power supply current.

This error detection apparatus dynamically changes the circuit by switching test patterns in succession and acquires a change in operation current $I_{DDT}$ at this time by a sampling unit, thereby detecting if an error exists or not. This method measures the transition of the operation current $I_{DDT}$ with change in the circuit state. If a circuit is defective such as being inoperable, the operation current $I_{DDT}$ changes to a different state compared with nondefective. Then, spectrum analysis is performed using Fourier transform, thereby detecting the defective. By extracting AC component and removing AC component in the operation current $I_{DDT}$ at this time, it is possible to obtain higher resolution and thus improves the sensitivity of eror detection.

The present invention, however, has recognized that the $I_{DDQ}$ test or the technique disclosed in Japanese Unexamined Patent Application Publication No. 2003-185698 described above have the following problems. First, the $I_{DDQ}$ test is incapable of accurate measurement since the current that is assumed to flow in error mode is too low with respect to the operation current. The operation current can be several tens mA order in some devices since each leakage current increases to as high as several tens to hundreds nA with miniaturization of the LSI manufacturing process. On the contrary, the current that flows through a bridge error can be as low as several hundreds µA or below.

Generally, the current measuring accuracy of a tester is within about 0.2% from a measurement range. Thus, though 100 mA range, for example, is needed to measure operation current of several tens mA order, the accuracy of this range is 100 mA*0.2%=200 µA. Therefore, if the current flowing to a bridge error is 100 µA, it is unable to detect the presence of the bridge error accurately with this accuracy.

On the other hand, the technique disclosed in Japanese Unexamined Patent Application Publication No. 2003-185698 continuously switches test patterns to switch between ON and OFF constantly without fixing the state of the transistor to ON or OFF state. It converts a change in current into a spectrum power by using Fourier transform to see if there is a difference from nondefective, thereby determining whether it is defective or not. Thus, this technique observe the power supply current ($I_{DDT}$) that flows when applying a test signal to an integrated circuit and analyzes it in frequency domain so as to detect abnormal power supply current due to an error in a short time. It is thus difficult to detect a bridge error that occurs in any transistor in an integrated circuit under test.

Thus, the technique disclosed in Japanese Unexamined Patent Application Publication No. 2003-185698 performs function testing to find a defect that one transistor of a CMOS inverter does not turns ON or OFF and so on, for example, by measuring dynamic operation current. It therefore switches test patterns constantly to change the state of a circuit dynamically, so that the CMOS inverter 201 always switches between High and Low. Therefore, leakage current (abnormal current) due to a bridge error flows and stops during measuring power supply current. Since the abnormal current due to a bridge error is very low current that is detectable when the CMOS inverter 201 becomes a fixed (static) state of High or Low, it is difficult to detect the abnormal current due to a bridge error with such a measuring technique that switches the CMOS inverter 201 between High and Low.

Recent LSI is required to reduce leakage current due to a bridge error as low as possible in order to further lower the power consumption particularly when it is used for a portable information equipment or the like. It is desirable to detect such a bridge error also for the purposes of improvement in product quality, elimination of life-time defect, increase in reliability, reduction in total test costs and so on.

SUMMARY OF THE INVENTION

According to an aspect of the present invention, there is provided an error detection method that includes setting an integrated circuit under test to be tested at a stationary point in an arbitrary stationary state, supplying a modulated voltage signal modulated at a predetermined frequency to the integrated circuit under test, extracting a determination signal after removing DC component from an observation signal containing information on power supply current flowing through the integrated circuit under test at the stationary point, and determining presence or absence of an error in the integrated circuit under test based on a size of spectral component of the determination signal at the predetermined frequency.

The error detection method applies a modulated voltage signal as power supply to an integrated circuit under test and extracts a determination signal after removing DC component from an observation signal obtained form the integrated circuit under test, which results that information on the power supply current appears at a predetermined frequency in the determination signal. It is therefore possible to determine the presence or absence of an error in the integrated circuit under test by focusing only on spectral component at the predetermined frequency, disregarding the other frequency component as noise.

According to another aspect of the present invention, there is provided a signal extraction circuit that includes a power supply generator supplying a modulated voltage signal modulated at a predetermined frequency to an integrated circuit under test to be tested set at a stationary point in an arbitrary stationary state, and a determination signal extractor extracting a determination signal after removing DC component from an observation signal containing information on power supply current flowing through the integrated circuit under test at the stationary point and supplying the determination signal to a determination device which determines presence or absence of an error in the integrated circuit under test based on a size of spectral component of the determination signal at the predetermined frequency.

In this signal extraction circuit, a determination signal at a predetermined frequency extracted by the determination signal extractor contains information on power supply current. Thus, by supplying this signal to the determination device, the determination device analyzes the size of spectral component at the predetermined frequency, thereby allowing simple and accurate determination of the presence or absence of an error.

According to yet another aspect of the present invention, there is provided an error detection apparatus that includes a stationary point setting portion setting an integrated circuit under test to be tested at a stationary point in an arbitrary stationary state, a power supply generator supplying a modulated voltage signal modulated at a predetermined frequency to the integrated circuit under test set at the stationary point, a determination signal extractor extracting a determination signal after removing DC component from an observation signal containing information on power supply current flowing through the integrated circuit under test at the stationary point, and a determinator determining presence or absence of an error in the integrated circuit under test based on a size of spectral component of the determination signal at the predetermined frequency.

The error detection apparatus sets the integrated circuit under test at a stationary point in an arbitrary stationary state and obtains information on power supply current at the stationary point as an observation signal superposed with the modulated voltage signal modulated at a predetermined frequency. The apparatus performs spectral analysis on the determination signal after extracting AC component only from the observation signal and focuses on the size of spectral component at the predetermined frequency, thereby determining the presence or absence of an error in the integrated circuit under test. The present invention therefore allows measuring $I_{DDQ}$ at the stationary state where the effect of noise or the like can be eliminated, thereby enabling accurate error determination.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

An embodiment of the present invention is described hereinafter in detail with reference to the drawings. A test apparatus of this embodiment supplies a test pattern to an integrated circuit under test which is to be determined as defective or nondefective. It then calculates a difference between power supply current (static current $I_{DDQ}$) in one stationary state and a static current $I_{DDQ}$ in another stationary state or a difference between a static current $I_{DDQ}$ flowing through the integrated circuit under test in one stationary state and a static current $I_{DDQ}$ of a reference integrated circuit as a comparative circuit, and determines presence or absence of a bridge error in the integrated circuit under test.

In a large scale LSI composed of CMOS circuits with several tens of thousands of gates, a ratio of the number of inverters at High level and the number of inverters at Low level is substantially the same even if a change in the state occurs due to a change in a test point. Thus, in an ideal state without an error such as a bridge error, operation current stays substantially the same in spite of a change in a test point, thus being difficult to detect abnormal current. Therefore, this embodiment detects the presence or absence of abnormal current by measuring power supply current (static current $I_{DDQ}$) when each CMOS inverter of an integrated circuit under test is fixed to High or Low. Particularly, this embodiment measures a static current $I_{DDQ}$ in a plurality of different stationary states (stationary points) in an integrated circuit under test and determines if there is a defect based on a difference of them (a static current $I_{DDQ}$ difference).

The current flowing through a bridge error is extremely low with respect to the static current $I_{DDQ}$ as described above. However, the leakage current is operation current in the stationary state. Thus, regarding an LSI as a collection of CMOS inverters, the operation current in the stationary state is a sum of the leakage current of CMOS inverters. Therefore, though each leakage current is as small as several hundreds of pA to several nA, large current (μA to mA) is consumed as a whole if there are several millions of bridge errors, which hinders reduction in power consumption of LSI.

On the other hand, the current flowing through a bridge error is extremely low as described above and it is thus difficult to detect a static current $I_{DDQ}$ difference in the current flowing through the bridge error due to measurement accuracy. Further it is subject to the effect of noise or the like.

As a result of intensive research, the inventor of the present invention has found that the static current $I_{DDQ}$ difference can be measured by the following process. This process first modulates a power supply voltage to a predetermined frequency and supplies it to an integrated circuit under test, which is a device under test (DUT). Then, the process extracts only AC component from the power supply voltage of the integrated circuit under test and performs frequency division thereon. The process then examines the obtained result for a change in the level of spectral component at the predetermined frequency after modulation, thereby removing the effect of noise to measure a static current $I_{DDQ}$ difference highly accurately. Finally, the process determines the presence or absence of an error based on the static current $I_{DDQ}$ difference thus obtained. It is thereby possible to detect very low leakage current, which has been difficult to detect in a conventional technique, thus improving an error detecting accuracy.

Figure 1A:
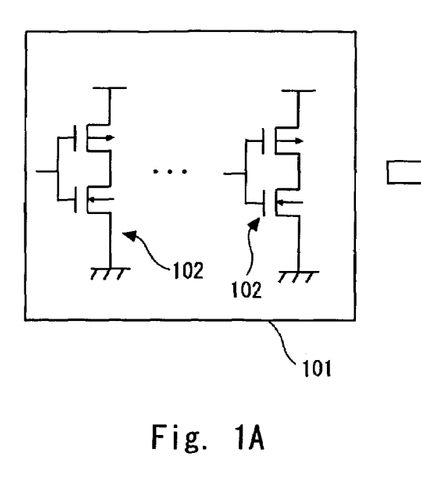
FIG. 1A is a view to describe that an integrated circuit is composed of a large number of CMOS inverters.
Figure 1B:
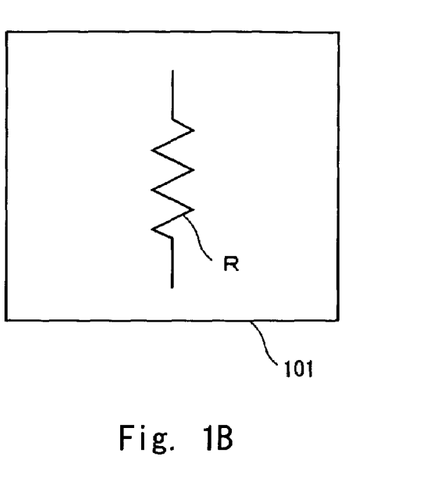
FIG. 1B is a view to describe that the integrated circuit is regarded as an equivalent circuit is one resistor in the case of FIG. 1A.

The principle of a test method for an integrated circuit under test according to an embodiment of the present invention is described herein to facilitate the understanding of the invention. FIG. 1 is a view to describe the principle of this invention. As shown in FIG. 1A, if the integrated circuit 101 is regarded as a collection of a large number of CMOS inverters 102, if the output of each CMOS inverter 102 is fixed to High or Low, the integrated circuit 101 can be regarded equivalently as one resistor R.

A method of testing an integrated circuit under test using a static current $I_{DDQ}$ difference according to this embodiment, which is referred to herein as a static current $I_{DDQ}$ difference test, measures static power supply current ($I_{DDQ}$) that flows through the integrated circuit 101 at one stationary point (measurement point) in measurement points in such an arbitrary stationary state, also measures static power supply current ($I_{DDQ}$) that flows through the integrated circuit 101 in another stationary state, and calculates a static current $I_{DDQ}$ difference between the two, thereby determining the presence or absence of a bridge error based on the static current $I_{DDQ}$ difference.

Upon occurrence of a bridge error, leakage current flows through a CMOS inverter through the bridge error. The static current $I_{DDQ}$ that flows through the integrated circuit 101 due to the bridge error increases. In other words, the current value flowing through the resistor R is higher than an original value. Measuring a change in the static current $I_{DDQ}$ that flows through the integrated circuit 101 allows detection of the presence or absence of a bridge error.

Figure 2:
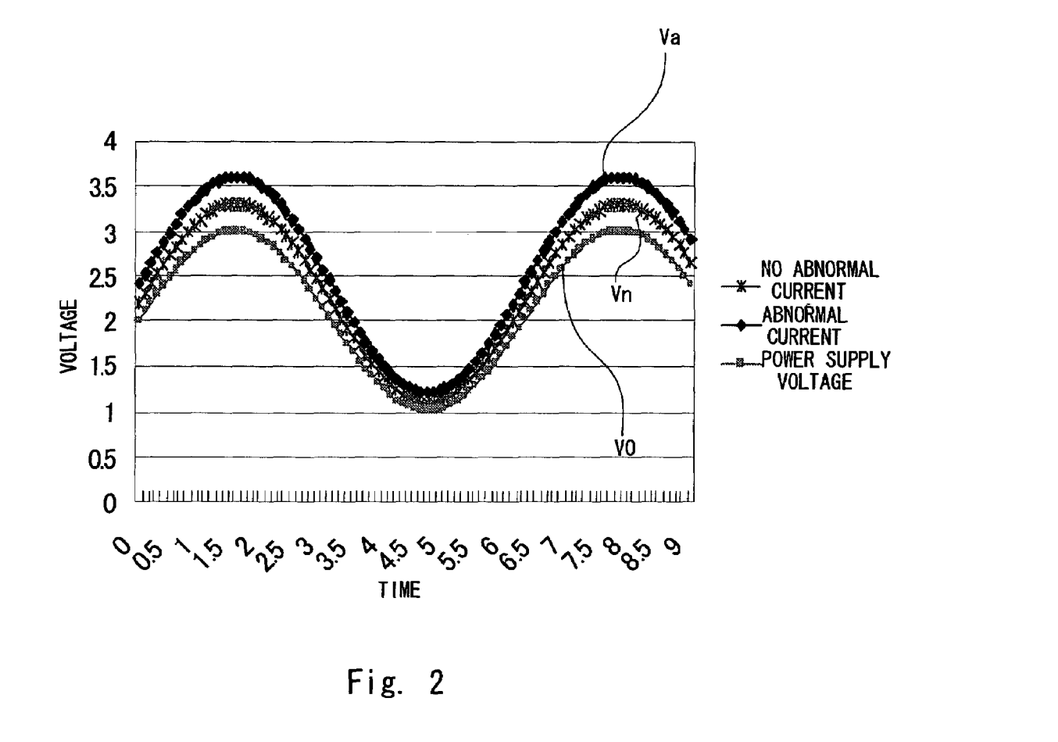
FIG. 2 is a graph showing results of simulation of a change according to presence or absence of an error in power supply to the integrated circuit of FIG. 1B that is regarded as the equivalent circuit.

Therefore, this embodiment converts the static current $I_{DDQ}$ into a voltage and acquires a change in the static current $I_{DDQ}$ as a voltage change. FIG. 2 shows the simulation result of a change in a voltage converted from the static current $I_{DDQ}$. FIG. 2 is a graph indicating a voltage change due to the presence or absence of errors such as a bridge error, with the vertical axis representing a voltage and the horizontal axis representing time. In FIG. 2, a power supply voltage V0 of the integrated circuit 101 is modulated by a predetermined frequency. It enlarges the amplitude of a power supply voltage in order to easily distinguish between a circuit having an error (with abnormal current flow) and a circuit not having an error (without abnormal current flow). Further, the waveforms of abnormal current and normal current are indicated as a result of converting power supply current flowing through the integrated circuit 101 into a voltage by a resistor (resistance r) and superposing it, which is referred to herein as an observation voltage.

When the integrated circuit is regarded as the resistor R shown in FIG. 1B, if the current flowing through the resistor R in the state without abnormal current, which corresponds to power supply current, is normal current In, an observation voltage Vn without abnormal current is V0+In*r. On the other hand, if a bridge error occurs, the equivalent resistor R is regarded to decrease, and the current flowing through the resistor R that is regarded as an integrated circuit becomes Ia. The current Ia is the normal current In added with abnormal current Ie. An observation voltage Va when the abnormal current Ie exists is V0+In*r=V0+(In +Ie)*r. Thus, the frequency amplitude of the voltage Va increases by the amount of abnormal current Ie, which is Ie*r, as shown in FIG. 2. Calculating a difference in the amplitude allows detecting the presence or absence of abnormal current, which is the presence or absence of errors such as a bridge error.

The abnormal current flowing through an error portion is very low with respect to operation current and therefore optimization of measurement range is difficult. Further, it is subject to noise. Thus, this embodiment modulates the frequency of a power supply voltage to be supplied to an integrated circuit into an appropriate frequency to produce a change in the amplitude of a sinusoidal voltage in order to extract current change information indicating the presence or absence of abnormal current accurately. It supplies the modulated voltage signal as power and converts the information of static current $I_{DDQ}$ consumed at a given measurement point of an integrated circuit under test into a voltage and superposes it onto the modulated voltage signal. It is thereby possible to acquire a change in the amplitude at modulation frequency as information indicating the presence or absence of abnormal current in the static current $I_{DDQ}$ and disregards the other frequency component as noise or the like, thus enabling highly accurate determination of the presence or absence of an error without being affected by noise.

Figure 3:
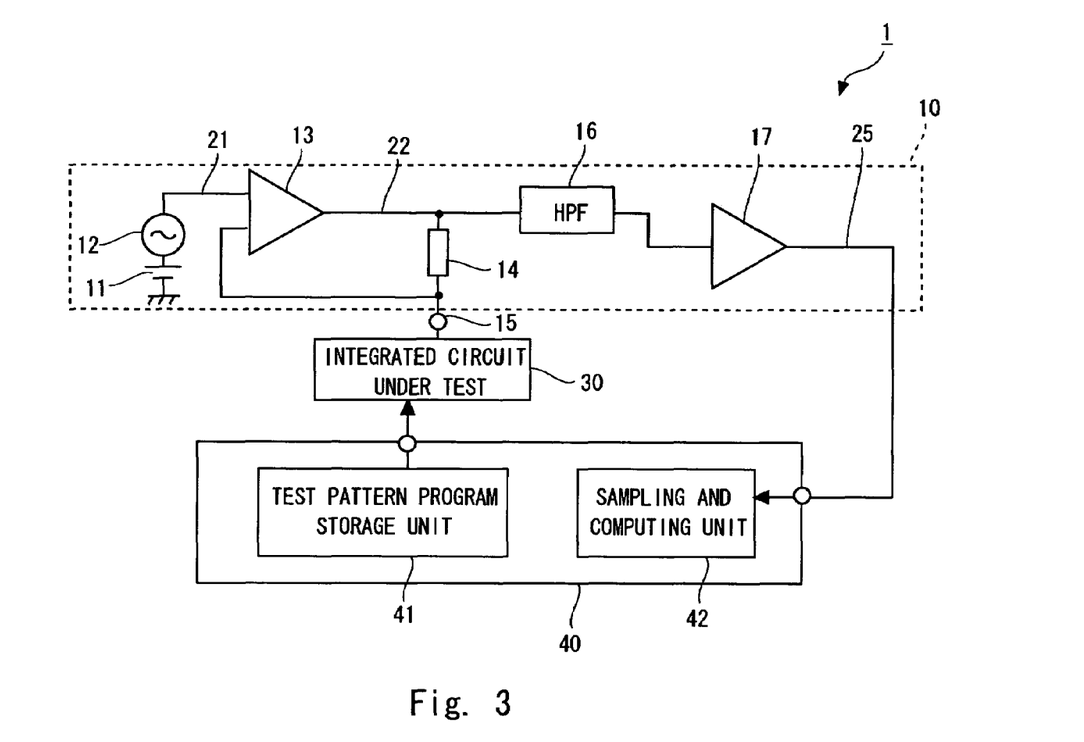
FIG. 3 is a block diagram showing an error detection apparatus of an integrated circuit according to a first embodiment of the preset invention.

An error detection apparatus for an integrated circuit according to this embodiment is described hereinafter. FIG. 3 is a block diagram showing an error detection apparatus for an integrated circuit according to a first embodiment of the invention. As shown in FIG. 3, the error detection apparatus 1 includes a determination signal extraction circuit 10 and a determination device 40. The determination device 40 analyzes a determination signal from the signal extraction circuit 10 and determines if an error exists or not.

The determination signal extraction circuit 10 extracts a determination signal for error determination from an observation signal containing information on power supply current flowing through an integrated circuit under test 30 at given measurement points. Thus, the signal extraction circuit 10 is connected to a power supply terminal 15 of the integrated circuit under test 30 and outputs a voltage signal composed only of AC component that has been modulated into a given frequency and corresponds to the current flowing through the integrated circuit under test 30 as a determination signal 25 and supplies it to a determination device 40. The signal extraction circuit 10 includes a power supply 11, a modulator 12 for modulating a power supply voltage into a modulated voltage signal 21 and an operational amplifier 13. The operational amplifier 13 is connected to a terminal 15 of the integrated circuit under test 30 and serves as an observation signal generator for outputting an observation signal 22 containing information on static current $I_{DDQ}$ of the integrated circuit under test 30. The signal extraction circuit 10 further includes a resistor 14 whose one end is connected to the output of the operational amplifier 13 and the other end is connected to the terminal 15 of the integrated circuit under test 30, a high-pass filter (HPF) 16 connected to the one end of the resistor 14 and serving as a DC component eliminator, and an amplifier 17 connected to the HPF 16.

The modulator 12 superposes a sinusoidal wave with a given frequency f0 on a power supply voltage to generate a modulated power supply voltage and supplies it to the non-inverting input of the operational amplifier 13. The frequency f0 is used in the determination device 40, which is detailed later, for extracting only spectral component of the frequency f0 and it may be selected arbitrarily. For example, it may be a frequency of about several tens of kHz to thousand kHz, for example, to allow for a time required for analysis. The modulated voltage signal 21 is a power supply voltage to the integrated circuit under test 30. The determination device 40 determines a gain ratio at this frequency, thereby allowing observation of an extremely small voltage change without being affected by noise or the like.

The resistor 14 converts the current supplied from the operational amplifier 13 to the integrated circuit under test 30, which is the current to be consumed by the integrated circuit under test 30 into a voltage. Thus, the output of the operational amplifier 13 is a voltage signal composed of a voltage converted from the static current $I_{DDQ}$ superposed on the modulated voltage signal 21. The voltage signal, which is referred to herein as the observation signal 22, contains information on the static current $I_{DDQ}$. Thus, the observation signal 22 contains current information indicating the presence or absence of abnormal current. If the integrated circuit under test 30 includes a bridge error, the current flowing through the resistor 14 contains abnormal current flowing through the bridge error.

The HPF 16 removes DC component from the observation signal 22. The amplifier 17 converts the amplitude of the signal after removing the DC component into arbitrary amplitude and outputs it as a determination signal 25.

The determination device 40 acquires the determination signal 25 output from the amplifier 17 at a given sampling point and analyzes it to determine the presence or absence of a bridge error. The determination device 40 includes a test pattern program storage unit 41 for supplying a test pattern to the integrated circuit under test 30 and a sampling and computing unit 42 for acquiring the determination signal 25 from the amplifier 17 at a given sampling point and the signal into frequency bands to determine if there is an error.

The test pattern program storage unit 41 serves as a stationary point setting portion that supplies a given test pattern to the integrated circuit under test 30 and sets a transistor included in the integrated circuit under test 30 to a stationary state where it is fixed to On or Off at a given measurement point. The test pattern may be previously stored in accordance with the integrated circuit under test 30 or may be generated by program stored in the test pattern program storage unit 41.

The sampling and computing unit 42 samples a determination signal, converts the time axis into frequency axis by Fast Fourier Transform (FFT) and analyzes the size of the spectral component at the modulation frequency in the modulator 12. It then calculates a different between the size of the spectral component at one measurement point and the size of the spectral component at another measurement point. If the difference is a predetermined threshold value or higher, for example, the sampling and computing unit 42 determines that there is an error.

It is also feasible to calculate the size of a spectral component at each measurement point in advance in a reference integrated circuit that has been determined to have no error and compare them with the size of a spectral component at each measurement point in the integrated circuit under test 30. Then, the sampling and computing unit 42 may determines that an error exists if there is a point where the obtained value is deviated from a reference value by the amount of a predetermined threshold value or higher, or there are more than a predetermined number of points where the obtained value is deviated from a reference value by the amount of a predetermined threshold value or higher.

Further, since the static current $I_{DDQ}$ is normally substantially the same low level in any measurement points in a nondefective circuit without an error, it is feasible to use an average of reference values at a plurality of measurement points in a reference integrated circuit instead of the reference value at each measurement point.

Figure 4:
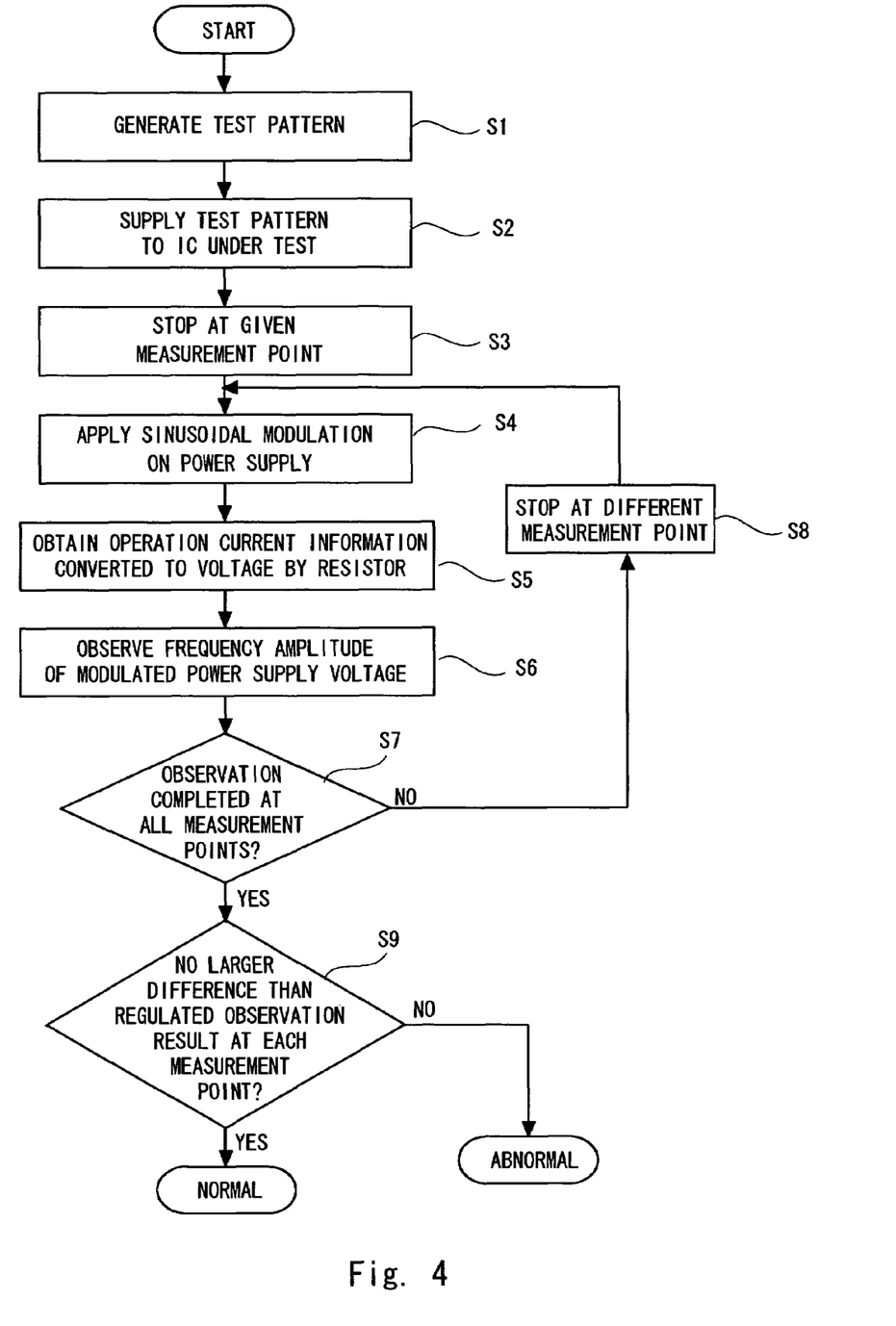
FIG. 4 is a flowchart showing a test method according to a first embodiment of the preset invention.

A test method according to this embodiment is described hereinafter. FIG. 4 is a flowchart showing a test method of this embodiment. The process first generates a test pattern of a test signal in the test pattern program storage unit 41 (Step S1). As described above, it is feasible at this step to use a test pattern that has been prepared previously, not generating it in the test pattern program storage unit 41. Then, the test pattern program storage unit 41 supplies a test signal to the integrated circuit under test 30 (Step S2). Then, the process scans the test pattern and holds it at a given measurement point of an arbitrary $I_{DDQ}$ measurement pattern (Step S3).

After that, the modulator 12 superposes a sinusoidal wave having a given amplitude on a power supply voltage from the power supply 11. The modulated voltage signal 21 is thereby supplied to the integrated circuit under test 30. The operational amplifier 13 outputs an observation signal 22 that is the modulated voltage signal 21 added with a change in a voltage converted in the resistor 14 from the static current $I_{DDQ}$ consumed in the integrated circuit under test 30. The observation signal 22 is a voltage signal that contains information on the static current $I_{DDQ}$ consumed in the integrated circuit under test 30. Then, the process measures the amplitude of the frequency of the sinusoidal wave of the observation signal 22 (Step S6).

Then, the process again scan the test pattern holds it at a different $I_{DDQ}$ measurement points (Step S8) and repeats the operation from the step S4. It changes measurement points in this way and obtains the observation signal 22 containing information on the static current $I_{DDQ}$ indicating the presence or absence of abnormal current in each measurement point. Then, if it is determined that the observation has been completed at all the measurement points (YES in Step S7), the process analyzes the observation result at each measurement point. This analysis may determine if a difference in the size of spectral component in the modulation frequency at each measurement point is less than a predetermined value or not, for example, and determine that it is abnormal (defective with an error) if the difference is large and it is normal (nondefective without an error) if the difference is small (Step S9). It is feasible to detect the presence or absence of an error based on comparison results with a reference value, not based on a difference in the size of spectral component, as described above.

Though this embodiment determines if the integrated circuit under test 30 is defective or nondefective based on the presence or absence of an error after completing observation on all the measurement points in Step S7, it is not limited thereto. It is feasible to determine if the integrated circuit under test 30 is defective or nondefective after measurement at one or a predetermined number of measurement points and ends the test upon detection of an error. It is thereby possible to end the test waiting for the completion of measurement at all the measurement points.

A method of extracting the determination signal 25 to be supplied to the determination device 40 from the observation signal 22 is described hereinafter. As described above, the determination signal 25 is a signal that is amplified by the amplifier 17 from the signal with only AC components, which is made by removing DC components from the observation signal 22 at each measurement point in the HPF 16.

Figure 5:
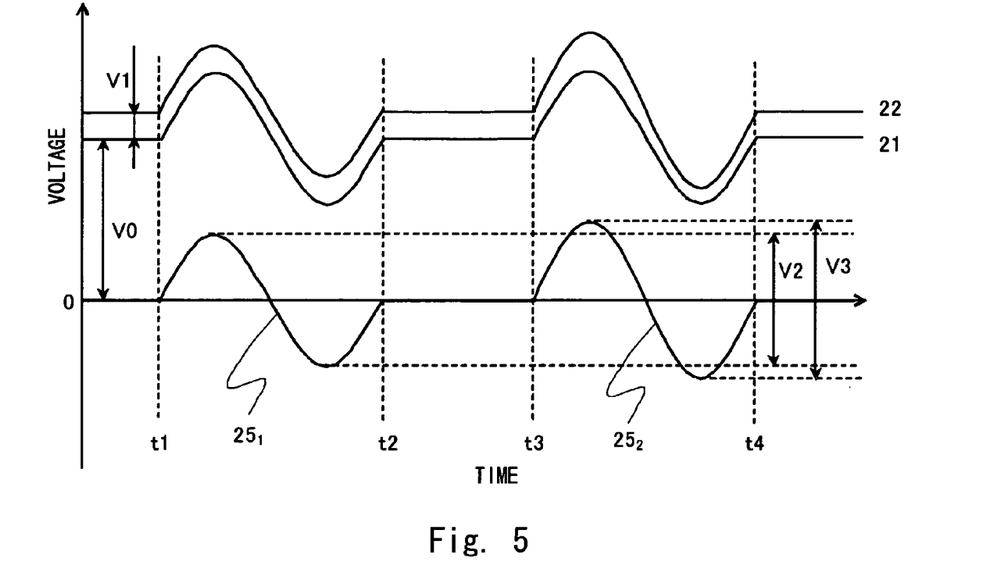
FIG. 5 is a view showing the waveforms of a modulated voltage signal 21, an observation signal 22 containing current information indicating the presence or absence of abnormal current or the like and a determination signal 25 obtained by removing DC component from the observation signal 22 to have AC component only.

FIG. 5 is a view showing the waveforms of the modulated voltage signal 21 that is modulated by the modulator 12, the observation signal 22 containing current information indicating the presence or absence of abnormal current or the like, and the determination signal 25 having AC component only, which is obtained by removing DC component from the observation signal 22. Though FIG. 5 shows the waveform of one cycle only, it is feasible to measure the waveforms of a plurality of cycles and average them. Further, though the determination signal 25 is obtained by amplifying the output of the HPF 16 to predetermined amplitude in the amplifier 17, it is described herein as: the output of the HPF 16=the output of the amplifier 17=the determination signal 25 for simplification of description.

In FIG. 5, t1 and t3 indicate times of given measurement points, which are a measurement point 1 and a measurement point 2, respectively, in this case. The integrated circuit under test 30 is set to the stationary state from time t1 as a measurement point 1 to time t2 and power supply current (static current $I_{DDQ}$) consumed by the integrated circuit under test 30 during the stationary state is observed. Further, the static current $I_{DDQ}$ of the integrated circuit under test 30 in the stationary state is observed from time t3 as a measurement point 2 to time t4.

As shown in FIG. 5, the modulated voltage signal 21 is a voltage signal that is modulated from the voltage v0 to a sinusoidal wave with the frequency f0, and it is a sinusoidal voltage signal with the frequency f0. V0 represents DC component of the voltage signal 21. The observation signal 22 is a voltage signal containing information on the static current $I_{DDQ}$ consumed by the integrated circuit under test 30 in the stationary state at the measurement points 1 and 2. The static current $I_{DDQ}$ consumed by the integrated circuit under test 30 is converted to a voltage by the resistor 14 and superposed onto the modulated voltage signal 21. Thus, this is a higher voltage than the modulated voltage signal 21. V1 represents DC component superposed by the static current $I_{DDQ}$.

A defective that consumes large current by a bridge can be detected by checking a change in the amplitude of the observation signal 22 in the measurement points 1 and 2. However, the observation signal 22 has large DC component (V0+V1) with respect to its amplitude change. Thus, the HPF 16 removes unnecessary DC component (V0+V1) from the observation signal 22 to generate the determination signal 25 having AC component only. The determination signal 25 may be amplified to a given amplitude value according to need. In FIG. 5, the determination signal at the measurement point 1 is represented as $25_1$ and the determination signal at the measurement point 2 is represented as $25_2$.

The observation signal 22 has the same waveform at the measurement point 1 and 2 if a bridge error or the like does not occur in the integrated circuit under test 30. Thus, in a non-defective circuit, there is no difference in level of the static current $I_{DDQ}$ flowing through the integrated circuit under test 30, and no change appears in the amplitude of the determination signal 25. On the other hand, if a bridge error occurs in the integrated circuit under test 30, current increases or decreases and thus a change appears in the amplitude of the determination signal 25. In this example, the static current $I_{DDQ}$ of the integrated circuit under test 30 is higher than normal state at the measurement point 2 due to a bridge error; accordingly, the amplitude of the determination signal $25_2$ is higher than the determination signal $25_1$ in normal state at the measurement point 1.

Since the determination signals $25_1$ and $25_2$ that are generated by extracting AC component only shown in FIG. 5 includes noise in practice, it is difficult to calculate a voltage difference $\Delta V(V3-V2)$ between the determination signal $25_1$ at the measurement point 1 and the determination signal $25_2$ at the measurement point 2. On the other hand, since the observation signal 22 and the determination signal 25 are modulated at frequency f0 in this embodiment, the determination can only focus on the frequency f0 of the sinusoidal wave. It is therefore possible to perform Fourier transform on the acquired determination signal 25 and compare a change in the amplitude at the frequency f0 to make a determination. Since the frequency component can be selected in the determination, it is able to remove disturbance due to noise and performs highly accurate measurement with an appropriate measurement range.

Figure 6A:
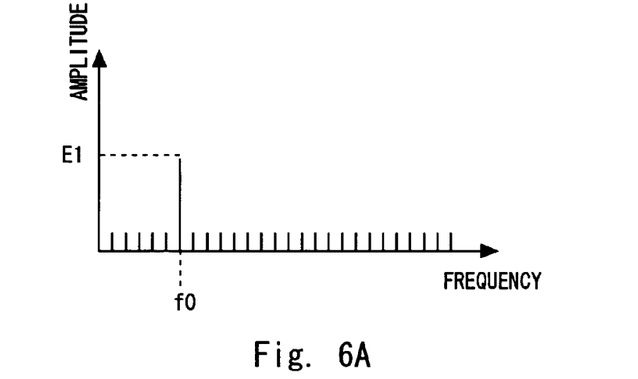
FIGS. 6A and 6B are pattern diagrams showing spectral components obtained by converting the time axis of the determination signal 25 at a measurement point and a measurement point 2, respectively, into the frequency axis.
Figure 6B:
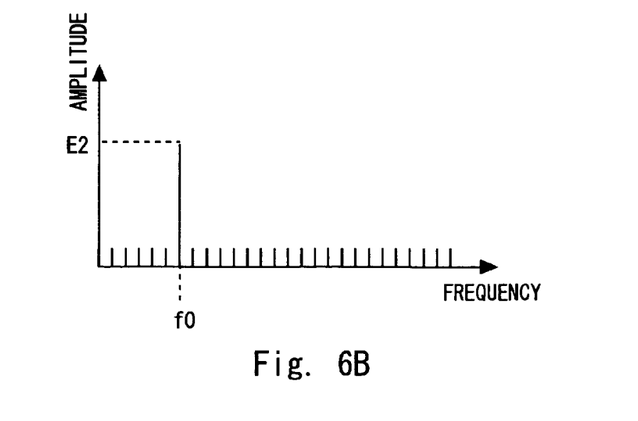

When extracting a static current $I_{DDQ}$ difference in each measurement point, the determination device first samples the output of the amplifier 17 and performs Fast Fourier transform (FFT) on the sampling data. If the frequency of the sinusoidal wave to modulate the power supply voltage is f0, a change in the static current $I_{DDQ}$ can be observed as an amplitude change of the f0 component in the determination signal 25. FIGS. 6A and 6B are pattern diagrams showing the data that converts the time axis into the frequency axis in the determination signals $25_1$ and $25_2$ at the measurement points 1 and 2, respectively. Conversion to a signal where the horizontal axis is frequency by FET allows calculating energy at the modulation frequency f0. FIG. 6A shows the amplitude (energy) E with the modulation frequency f0 at the measurement point 1, and FIG. 6B shows the energy E2 with the modulation frequency f0 at the measurement point 2.

There are three methods of determination with use of the energy E1 and E1. A first method calculates a difference (E1−E2) between the energy E1 with the modulation frequency f0 at the measurement point 1 and the energy E2 with the modulation frequency f0 at the measurement point 2. This allows not only determining the presence or absence of abnormal current but also changeling offset error in the amplifier 17. A second method calculates a different between the energy E1 and the energy E2 and then calculates a ratio ((E1−E2)/E1). This allows not only determining the presence or absence of abnormal current but also changeling offset error and gain error in the amplifier 17. A third method calculates a ratio (E1/E2) of the energy E1 and the energy E2. This allows not only determining the presence or absence of abnormal current but also changeling gain error in the amplifier 17.

Though the energy E1 and E2 are described herein as the energy at the measurement points 1 and 2, respectively, it is feasible to set the energy (reference value) at one or a plurality of measurement points in a reference integrated circuit to E2 as described above. In this case, it is possible to cancel gain error and offset error with a reference value by not only calculating a difference between the energy (comparative value) E1 of the integrated circuit under test 30 and the reference value E2 but also calculating a ratio after obtaining the different or calculating a ratio of the both energy values.

In this way, the determination device 40 calculates a difference or a ratio (comparative value) in energy E at each measurement point, compares them, and determines if the integrated circuit under test 30 is defective or nondefective based on the comparison result. For example, if a comparative value at each measurement point is a predetermined threshold value or higher, the integrated circuit under test 30 may be determined to be defective. It is also feasible to test a nondefective circuit beforehand and calculate a difference between comparative values at each measurement point and if a difference in comparative values in the integrated circuit under test 30 is deviated from the difference between comparative values in the nondefective circuit by the amount of a predetermined threshold or greater, the integrated circuit under test 30 may be determined to be defective.

This embodiment utilizes that a bridge error causes the static current $I_{DDQ}$ to increase at the measurement point. At a given measurement point of an arbitrary test pattern, the circuit is set to the stationary state where the transistor is fixed to On or Off. At this time, it supplies the modulated voltage that has been modulated to have a predetermined frequency f0 to the integrated circuit under test 30 and extracts the power supply information containing consumption current (static current $I_{DDQ}$) in the integrated circuit under test 30. Then, it calculates a difference in the static current $I_{DDQ}$ at each measurement point with a predetermined frequency f0, thereby removing the effect of noise and detecting the presence or absence of abnormal current with a significantly high measurement accuracy.

As described above, this embodiment converts a current difference due to abnormal current into an amplitude change in a sinusoidal wave by performing modulation of the power supply voltage by superposing a sinusoidal wave thereon and modulation of operation current into a sinusoidal voltage by the resistor at a test point of an arbitrary test pattern, and further performs Fourier transform thereon and compares the amplitude at the modulation frequency. It is thereby possible to measure a difference in the static current $I_{DDQ}$ without being affected by noise or the like, thus allowing detection of the presence or absence of a bridge error highly accurately.

Figure 7:
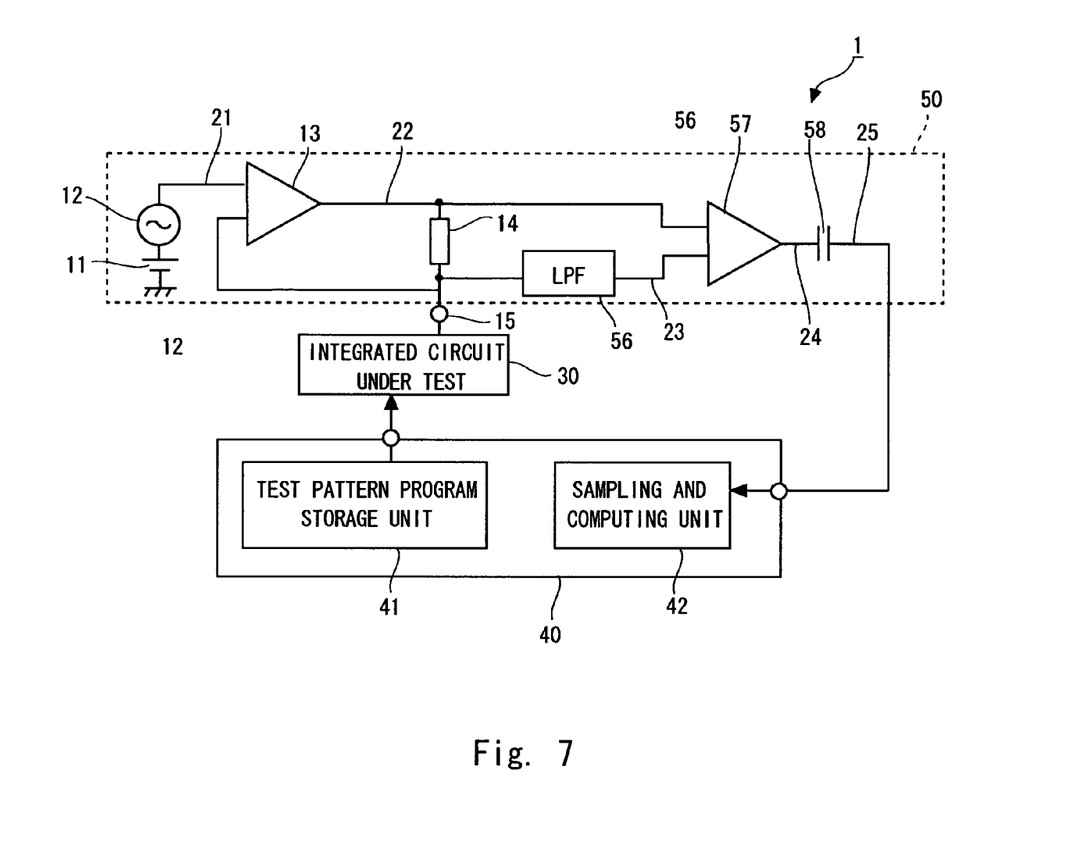
FIG. 7 is a block diagram showing an error detection apparatus of a second embodiment of the present invention.

The second embodiment of the present invention is described hereinafter. FIG. 7 is a block diagram showing an error detection apparatus according to an embodiment of the present invention. The same elements as in the first embodiment shown in FIG. 1 are denoted by the same reference numerals and not detailed herein. In the first embodiment described above has the signal extraction circuit 10 that amplifies the signal whose DC component has been removed by the HPF 16 in the amplifier 17. On the other hand, this embodiment has a signal extraction circuit 50 that includes a LPF 56, a differential amplifier 57 and a capacitor 58 for removing DC component and amplifying the obtained signal.

Specifically, the signal extraction circuit 50 of this embodiment includes a power supply generator composed of the power supply 11 and the modulator 12, the operational amplifier 13, the resistor 14, the low-pass filter LPF 56, the differential amplifier 57, and the capacitor 58.

The operational amplifier 13 outputs the observation signal 22 containing the current information on the power supply current consumed by the integrated circuit under test 30. The resistor converts the static current $I_{DDQ}$ of the integrated circuit under test 30 into a voltage. The low-pass filter LPF 56 is connected to the resistor 14 in the side of the integrated circuit under test 30 and serves as an AC component removing portion for removing AC component from the modulated voltage signal 21 and outputting a DC signal 23 having DC component only. The differential amplifier 57 serves as a differential signal generator that amplifies a difference between the observation signal 22 containing the current information on the static current $I_{DDQ}$ consumed by the integrated circuit under test 30 and the DC signal 23. The capacitor 58 serves as a determination signal output portion for removing DC component from the output of the differential amplifier 57, which is a differential signal 24, and extracting AC component only.

Figure 8A:
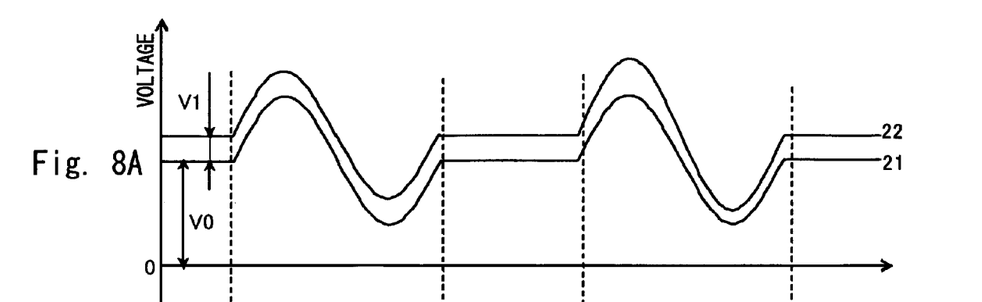
FIGS. 8A to 8D are views showing signal waveforms output from each block of the error detection apparatus of the second embodiment, FIG. 8A showing a modulation voltage signal 21 and an observation signal 22 containing information of consumption current during stationary time (static current $I_{DDQ}$) that flows through an integrated circuit under test, FIG. 8B showing a signal 23 after removing AC component by LPF, FIG. 8C showing a differential signal 24 indicating a difference between the observation signal 22 and the signal 23 produced by a differential amplifier 57, and FIG. 8D showing a determination signal 25 after removing DC component from the differential signal 24.
Figure 8B:
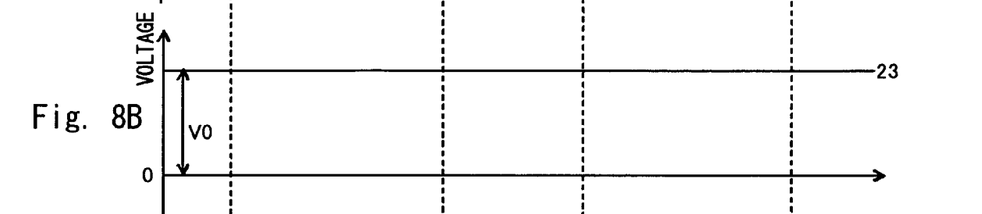
Figure 8C:
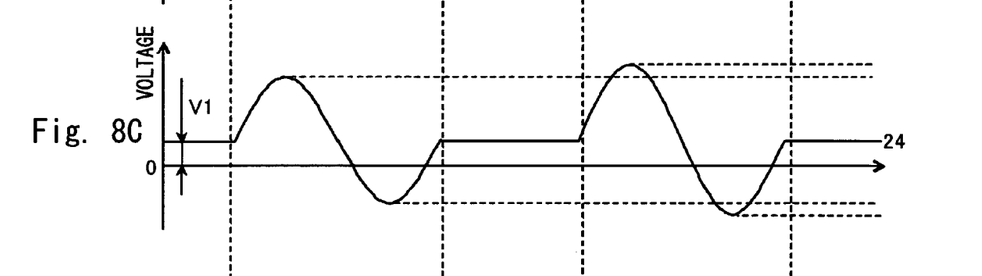
Figure 8D:
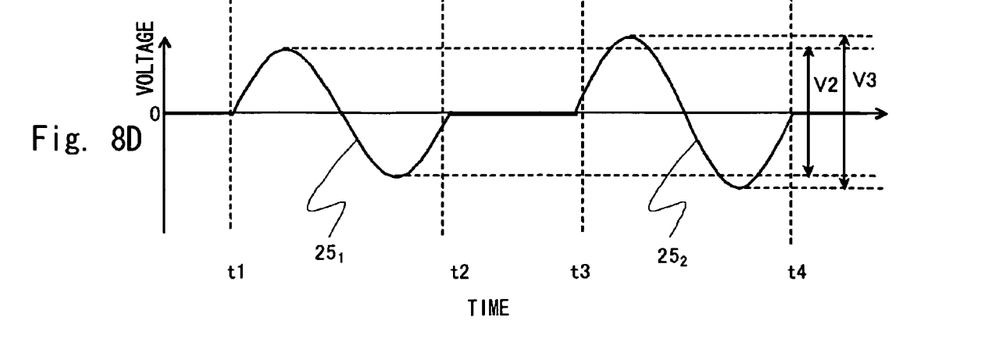

FIGS. 8A to 8D show the waveforms of the signals output from each block of the error detection apparatus according to this embodiment. FIG. 8A shows the modulation voltage signal 21 and the observation signal 22 containing information on consumption current during stationary time (static current $I_{DDQ}$) that flows through the integrated circuit under test. FIG. 8B shows the DC signal 23 after removing AC component by LPF 56. FIG. 8C shows the differential signal 24 that is a difference between the observation signal 22 and the DC signal 23 generated by the differential amplifier 57. FIG. 8D shows the determination signal 25 after removing DC component from the differential signal 24.

The modulation voltage signal 21 and the observation signal 22 shown in FIG. 8A are the same as those in the first embodiment. The modulation voltage signal 21 is modulated from the voltage V0 at a predetermined frequency f0. The observation signal 22 is generated by converting the static current $I_{DDQ}$ consumed by the integrated circuit under test 30 in the stationary state into a voltage in the resistor 14 and superposes it onto the modulated voltage signal 21.

The low-pass filter LPF 56 is connected between the terminal 15 to supply the modulated voltage signal 21 to the integrated circuit under test 30 and the resistor 14. It removes AC component from the modulated voltage signal 21 to generate the DC signal 23 having DC component only. The level of the DC signal 23 composed only of DC component is V0.

The differential amplifier 57 outputs a signal 24 that is generated by amplifying a differential voltage between the observation signal 22 and the DC signal 23 at a given ratio. FIG. 8C shows a differential voltage between the observation signal 22 and the DC signal 23 for simplification of description. The differential signal 24 has DC component V1 obtained by converting. The capacitor 58 removes the DC component V1 from the differential signal 24 and generates determination signals $25_1$ and $25_2$ having AC component only. The determination signals $25_1$ and $25_2$ are signals at given measurement points 1 and 2.

The measurement process first scans the test pattern and holds it at a given measurement point 1. Then, the power supply 11 and the modulator 12 generate the modulated voltage signal 21 composed of a power supply voltage superposed with a sinusoidal wave at a predetermined frequency. The operational amplifier 13 outputs the observation signal 22 that is the modulated voltage signal 21 added with a voltage converted from the static current $I_{DDQ}$ of the integrated circuit under test 30 by the resistor 14.

Then, after a certain cycle of a sinusoidal wave, it shifts to a different $I_{DDQ}$ measurement point 2. If the circuit is nondefective, the current value flowing through the integrated circuit under test is substantially the same and therefore no change appears in the amplitude of the observation signal 22. On the other hand, if a bridge error exists, the current increases or decreases and the amplitude changes between measurement points as in the observation signal 22 shown in FIG. 8A. Since the observation signal 22 has a large DC component with respect to a change in amplitude, the differential amplifier 57 calculates a difference between the output of the LPF 56, which is the DC signal 23, and the observation signal 22 to remove unnecessary DC component and amplifies the result. The capacitor 58 then extracts AC components only and outputs it as the determination signal 25. This signal is acquired by the determination device 40. The following process is the same as in the first embodiment.

In this embodiment also, a change in the static current $I_{DDQ}$ appears as a change in the amplification of the f0 component of the determination signals 25, and 252 at each measurement signal by modulating the power supply voltage at a predetermined frequency f0 and supplying it to the integrated circuit under test 30. In order to observe it, the sampling and computing unit 42 acquires the determination signal 25, performs Fourier transform thereon, and compares the size (amplitude) in spectral component at the frequency f0. Though the frequency component of noise is random, this embodiment allows only focusing on the amplitude of f0, and it is possible to divide noise as the frequency band different from f0, thereby canceling the effects such as noise and disturbance. Further, since this embodiment converts the current into a voltage and sets a measurement range with an appropriate modulation amplitude, it is possible to extract information on a difference in $I_{DDQ}$ with significantly high accuracy.

It is apparent that the present invention is not limited to the above embodiment that may be modified and changed without departing from the scope and spirit of the invention.

What is claimed is:

1. An error detection method comprising:
setting an integrated circuit to be tested to a stationary point wherein the integrated circuit comprises at least one inverter and wherein the at least one inverter is fixed to high or low;
supplying a voltage signal modulated at a predetermined frequency to the integrated circuit;
generating an observation signal containing information on power supply current flowing through the integrated circuit at the stationary point;
extracting a determination signal from the observation signal; and
detecting leak current and determining presence or absence of an error in the integrated circuit based on a size of spectral component of the determination signal at the predetermined frequency.

2. The error detection method according to claim 1, wherein the determination of the presence or absence of an error in the integrated circuit under test is performed based on a difference in size of the spectral component at a plurality of stationary points.

3. The error detection method according to claim 1, wherein the determination of the presence or absence of an error in the integrated circuit under test is performed based on a comparison result between a size of the spectral component at a plurality of stationary points and a reference value.

4. The error detection method according to claim 3, wherein the reference value is a size of the spectral component in a reference integrated circuit determined to be nondefective.

5. The error detection method according to claim 1 wherein the extraction of the determination signal removes DC component from the observation signal generated by converting power supply current flowing through the integrated circuit under test at the stationary point into a voltage and superposing the voltage onto the modulated voltage signal.

6. The error detection method according to claim 1, wherein the extraction of the determination signal calculates a differential signal between the observation signal generated by converting power supply current flowing through the integrated circuit under test at the stationary point into a voltage and superposing the voltage onto the modulated voltage signal and a DC signal after removing AC component from the modulated voltage signal, and removes DC component from the differential signal.

7. A signal extraction circuit comprising:
a power supply generator supplying a modulated voltage signal modulated at a predetermined frequency to an integrated circuit to be tested, wherein the integrated circuit is set at a stationary point and the integrated circuit comprises at least one inverter and wherein the at least one inverter is fixed to high or low; and
a determination signal extractor extracting a determination signal from an observation signal containing information on power supply current flowing through the integrated circuit at the stationary point and supplying the determination signal to a determination device which detects a leak current and determines presence or absence of an error in the integrated circuit based on a size of spectral component of the determination signal at the predetermined frequency.

8. The signal extraction circuit according to claim 7, wherein the determination signal extractor comprises:
an observation signal generator generating the observation signal by converting power supply current flowing through the integrated circuit under test at the stationary point into a voltage and superposing the voltage onto the modulated voltage signal; and
a DC component remover removing DC component from the observation signal and outputting the determination signal.

9. The signal extraction circuit according to claim 7, wherein the determination signal extractor comprises:
an observation signal generator generating the observation signal by converting power supply current flowing through the integrated circuit under test at the stationary point into a voltage and superposing the voltage onto the modulated voltage signal;
an AC component remover removing AC component from the modulated voltage signal;
a differential signal generator outputting a differential signal between the observation signal and a DC signal from the AC component remover; and
a determination signal output portion removing DC component from the differential signal and outputting the determination signal.

10. An error detection apparatus comprising:
a stationary point setting portion setting an integrated circuit to be tested at a stationary point, wherein the integrated circuit comprises at least one inverter and wherein the at least one inverter is fixed to high or low;
a power supply generator supplying a modulated voltage signal modulated at a predetermined frequency to the integrated circuit under test set at the stationary point;
a determination signal extractor extracting a determination signal from an observation signal containing information on power supply current flowing through the integrated circuit at the stationary point; and
a determinator which detects leak current and determines presence or absence of an error in the integrated circuit based on a size of spectral component of the determination signal at the predetermined frequency.

11. The error detection apparatus according to claim 10, wherein the determinator determines the presence or absence of an error in the integrated circuit under test based on a difference in size of the spectral component at a plurality of stationary points.

12. The error detection apparatus according to claim 10, wherein the determinator determines the presence or absence of an error in the integrated circuit under test based on a comparison result between a size of the spectral component at a plurality of stationary points and a reference value.

13. The error detection apparatus according to claim 12, wherein the reference value is a size of the spectral component in a reference integrated circuit determined to be nondefective.

14. The error detection apparatus according to claim 10, wherein the determinator performs Fourier transform on the determination signal, extracts a size of the spectral component at the predetermined frequency, and determines presence or absence of an error in the integrated circuit under test based on the extracted size of the spectral component.

15. The error detection apparatus according to claim 11, wherein the determinator performs Fourier transform on the determination signal, extracts a size of the spectral component at the predetermined frequency, and determines presence or absence of an error in the integrated circuit under test based on the extracted size of the spectral component.

16. The error detection apparatus according to claim 12, wherein the determinator performs Fourier transform on the determination signal, extracts a size of the spectral component at the predetermined frequency, and determines presence or absence of an error in the integrated circuit under test based on the extracted size of the spectral component.

17. The error detection apparatus according to claim 10, wherein the power supply generator comprises a power supply and a modulator superposing a sinusoidal wave at the predetermined frequency onto a voltage from the power supply.

18. The error detection apparatus according to claim 11, wherein the power supply generator comprises a power supply and a modulator superposing a sinusoidal wave at the predetermined frequency onto a voltage from the power supply.

19. The error detection apparatus according to claim 12, wherein the power supply generator comprises a power supply and a modulator superposing a sinusoidal wave at the predetermined frequency onto a voltage from the power supply.

20. The error detection apparatus according to claim 13, wherein the power supply generator comprises a power supply and a modulator superposing a sinusoidal wave at the predetermined frequency onto a voltage from the power supply.

21. The error detection method according to claim 1, wherein the presence or absence of an error in the integrated circuit is automatically determined by a computing unit.

22. The error detection method according to claim 1, further comprising removing DC component from the observation signal.

23. The signal extraction circuit according to claim 7, wherein the determination signal extractor removes DC component from the observation signal.

24. The error detection apparatus according to claim 10, wherein the determination signal extractor removes DC component from the observation signal.

* * * * *